United States Patent
Eshraghi et al.

(10) Patent No.: US 6,466,143 B2
(45) Date of Patent: Oct. 15, 2002

(54) NON-RETURN-TO-ZERO DAC USING REFERENCE SINE WAVE SIGNALS

(75) Inventors: Aria Eshraghi, Woburn, MA (US); Ramkishore Ganti, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/824,565

(22) Filed: Apr. 3, 2001

(65) Prior Publication Data

US 2002/0140593 A1 Oct. 3, 2002

(51) Int. Cl.[7] .............................. H03M 3/00; H03M 5/06
(52) U.S. Cl. ......................................... 341/68; 341/143
(58) Field of Search .......................... 341/68, 143, 118, 341/120; 332/100; 360/48, 51; 375/308, 366

(56) References Cited

U.S. PATENT DOCUMENTS

| | | | |
|---|---|---|---|
| 4,975,699 A | * 12/1990 | Frey | 341/118 |
| 4,983,972 A | 1/1991 | Mills | |
| 5,056,118 A | 10/1991 | Sun | 375/342 |
| 5,528,239 A | 6/1996 | Swanson et al. | 341/143 |
| 5,557,635 A | 9/1996 | Laird | 375/250 |
| 5,610,606 A | 3/1997 | Fukunaga et al. | |
| 5,701,106 A | * 12/1997 | Pikkarainen et al. | 332/100 |
| 6,114,981 A | 9/2000 | Nagata | |
| 6,121,910 A | 9/2000 | Khoury et al. | 341/143 |
| 6,324,236 B1 | 11/2001 | Bladh | 375/375 |

OTHER PUBLICATIONS

Flikkema, Paul G., and Davisson, Lee D., Detection of Baseband Signals Using a Delta Modulator, May 1988, *IEEE Transactions on Information Theory*, vol. 34, No. 3, pp 537–543.

Flikkema, Paul G.; Davisson, Lee D. "Detection of Baseband Signals Using a Delta Modulator", IEEE Transactions on Information Theory, vol. 335, No. 3, May 1988, pp. 537–543.

W. Gao and W.M. Snelgrove, "A 950–MHz IF Second-Order Integrated LC Bandpass Delta–Sigma Modulator," May 1998, *IEEE Journal of Solid-State Circuits*, vol. 33, No. 5.

O. Shoaei and W.M. Snelgrove, "Design and Implementatioin of a Tunable 40 MHz–70 MHz Gm–C Bandpass ΔEModulator," Jul. 1997, *IEEE Transactions on Circuits and Systems–II: Analog and Digital Signal Processing*, vol. 44, No. 7.

* cited by examiner

*Primary Examiner*—Michael Tokar
(74) *Attorney, Agent, or Firm*—Connolly Bove Lodge & Hutz LLP; Joseph P. Abate (57) ABSTRACT

A digital to analog converter which produces a non-return to zero output voltage. Two SIN DAC converters having return to zero (RZ) output voltages connected to provide a common NRZ output signal. The SIN DAC converters receive the digital signal and a delayed version of the digital signal. The reference sine voltage applied to each SIN DAC have a respective phase shift so that the outputs from each SIN DAC are phase shifted. The combined phase shifted output signals produce an NRZ signal with a reduced susceptibility to clock signal jitter, and which contain significantly less high frequency content than the RZ output signal from a SIN DAC.

10 Claims, 10 Drawing Sheets

FIG. 1

PRIOR ART

WAVEFORM WITH JITTER

PRIOR ART
FIG. 2B

IDEAL CASE: NO JITTER

PRIOR ART

FIG. 5

PRIOR ART

NON-RETURN-TO-ZERO DAC USING REFERENCE SINE WAVE SIGNALS

FIELD OF THE INVENTION

The present invention relates to a high resolution, high order delta signal digital-to-analog converter. Specifically, a feed forward DAC is disclosed for converting a digital signal to a low noise analog signal which minimizes the effects of clock jitter on the noise floor of the analog signal.

Radio frequency communications systems such as cellular telephone systems employ significant amounts of digital processing to both transmit and receive signals. On the transmit side, information is processed on a digital level and only at the final radio frequency carrier level is the signal converted to an analog signal. The analog signal is then mixed with an RF carrier of the cellular telephone system for transmission.

The digital data processed below the radio frequency signal band is upwards to 16 bits wide. The high resolution digital signal may then be converted to a lower order bit signal using a digital signal modulator. However, it is desirable to maintain the same signal-to-noise ratio so that the reconverted signal on the receive side maintains the same resolution as the original digital signal.

The process of converting the digital signal to an analog signal introduces noise in the signal thereby limiting the resolution of the converted signal. The noise is strongly affected by the amount of phase jitter in the data being converted by the digital analog converter. Phase jitter on the incoming digital data to the DAC is the result of the phase jitter on the system clock which affects the digital data bit transitions producing the phase noise modulation. The phase noise modulation contributes to the noise floor of the resulting analog signal limiting the ability to obtain a high resolution of the analog signal level.

The present invention is directed to a DAC which maintains the high resolution of an incoming digital signal which is converted into an analog signal.

SUMMARY OF THE INVENTION

In carrying out the invention, a non return to zero (NRZ) SIN digital-to-analog converter (DAC) is provided for converting a digital input signal to an analog signal. The NRZ SIN digital-to-analog converter provides an sine wave output in response to a first state of a digital signal proportional to 1+COS 2πf(t), and in response to a second state of the digital signal, a sine wave signal proportional to −1−COS 2πf(t).

A second SIN digital to analog converter receives a delayed version of the digital signal. The output of the second SIN digital converter is phase shifted with respect to the output of the first sign digital converter, and the respective output signals are combined to produce a non-return to zero (NRZ) output voltage. The NRZ output voltage contains less high frequency content than produced by a return to zero (RZ) SIN DAC, and the only significant phase noise which results from phase jitter occurs during data transitions.

DESCRIPTION OF THE PREFERRED EMBODIMENT

Figure 1:
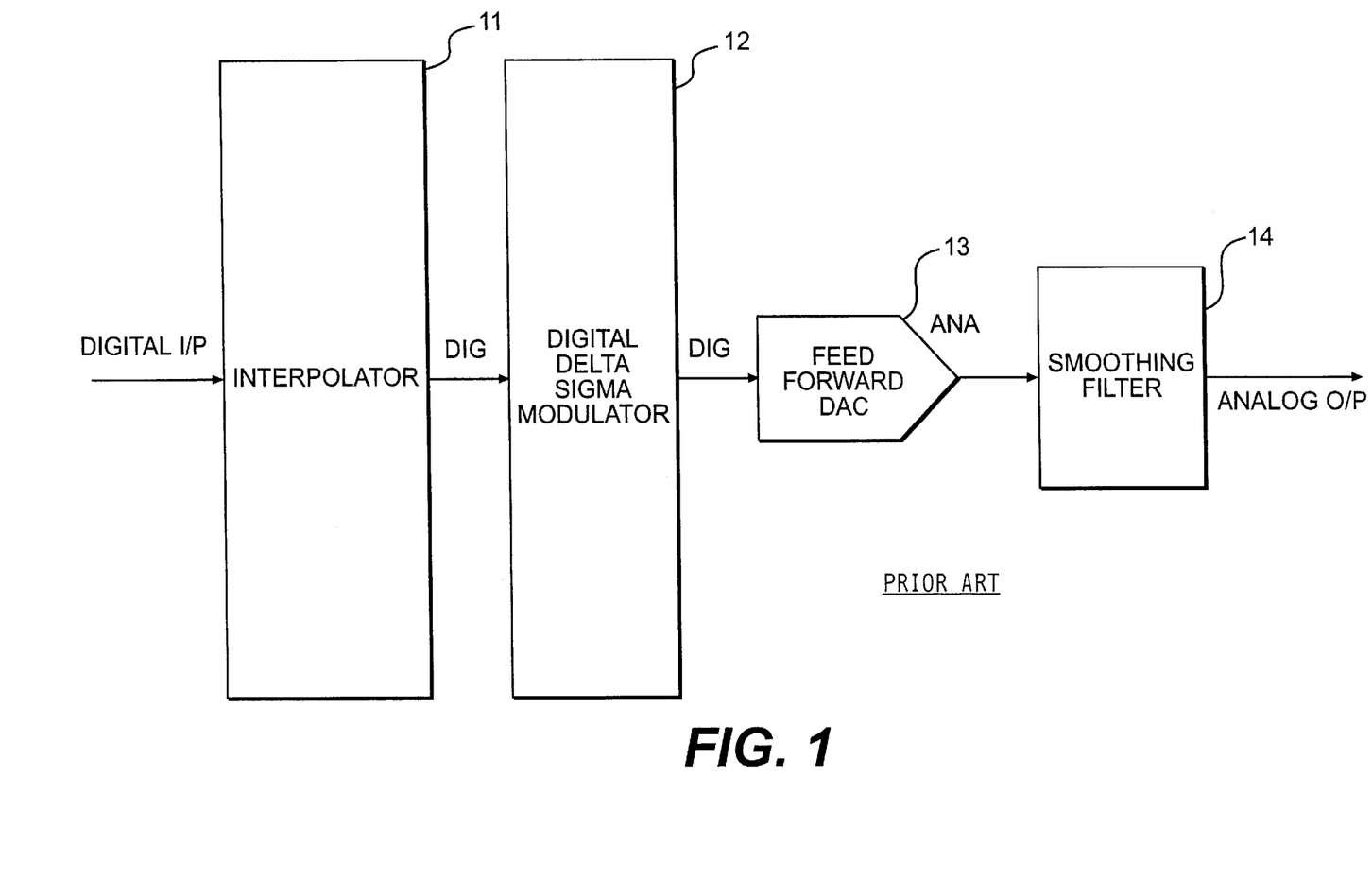
FIG. 1 illustrates the typical delta signal digital-to-analog converter architecture in a radio telephone communication system.

FIG. 1 illustrates a delta sigma digital-to-analog converter. The delta sigma digital-to-analog converter is included in the transmit chain of a wireless telephone communication device which is employed in the cellular telephone service. An interpolator 11 receives a digital signal representing information to be transmitted by the cellular telephone transmitter. The interpolator 11 converts the digital signal to a lower order digital signal and increases the data rate which is applied to a multibit digital delta signal modulator 12. The delta sigma modulator provides noise shaping of the digital signal and forwards the lower order digital signal to a feed forward DAC 13. The analog voltage produced by DAC 13 is supplied to a smoothing filter 14 which generates the analog signal for transmission on an RF carrier.

Figure 2A:
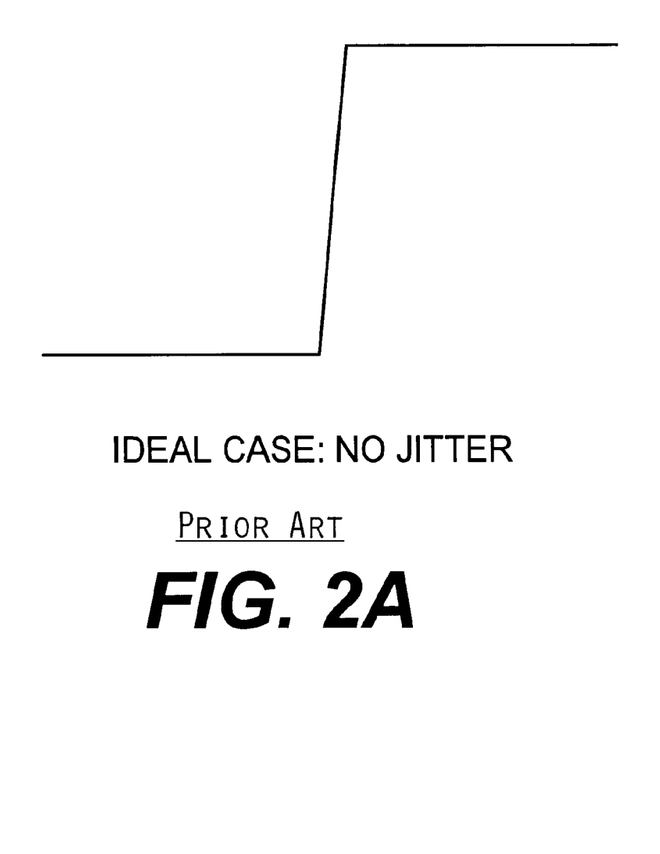
FIG. 2A illustrates the ideal clock signal having no jitter.
Figure 2B:
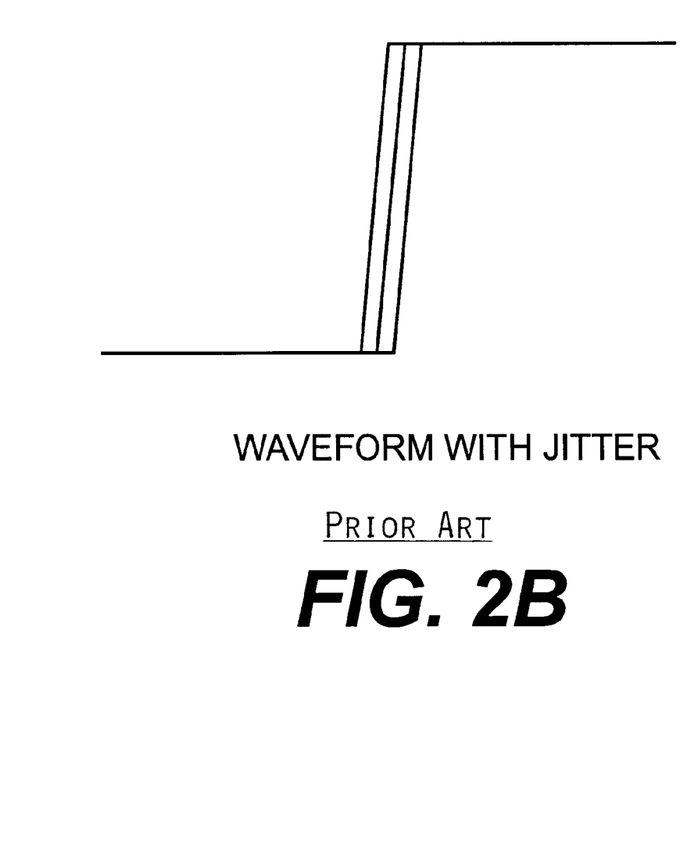
FIG. 2B illustrates the clock signal which is subject to phase jitter.

Phase jitter accompanying the digital data is a result of a short term clock instability in the digital processing system. FIG. 2A shows an ideal clock, wherein during a transition, no change in the location of the rising and falling edge of the clock pulse is seen. Practically, however, a certain amount of instability always accompanies a clock pulse, as illustrated in FIG. 2b. This instability in the clock signal edge is referred to as "jitter" and is also present on the data being converted, and is the source of phase noise derived from the feed forward DAC 13. The resulting phase jitter produces a noise floor which limits the signal-to-noise ratio of the transmitted signal. The signal is received at the receiving side of a cellular telephone communication system and is reconverted to a digital signal having resolution limited by the noise floor accompanying the input signal.

Using a SIN DAC to convert a digital data to an analog voltage reduces the effects of phasejitter on the signal noise floor. The SIN DAC is based on a pulse shaping process, wherein instead of providing a fixed DC level at the output of the DAC, the output energy is shaped sinusoidally, and data transitions occur only at the portion of a sine wave voltage which has a zero slope thereby reducing the sensitivity to clock jitter as will be explained with respect to FIG. 4.

Figure 3:
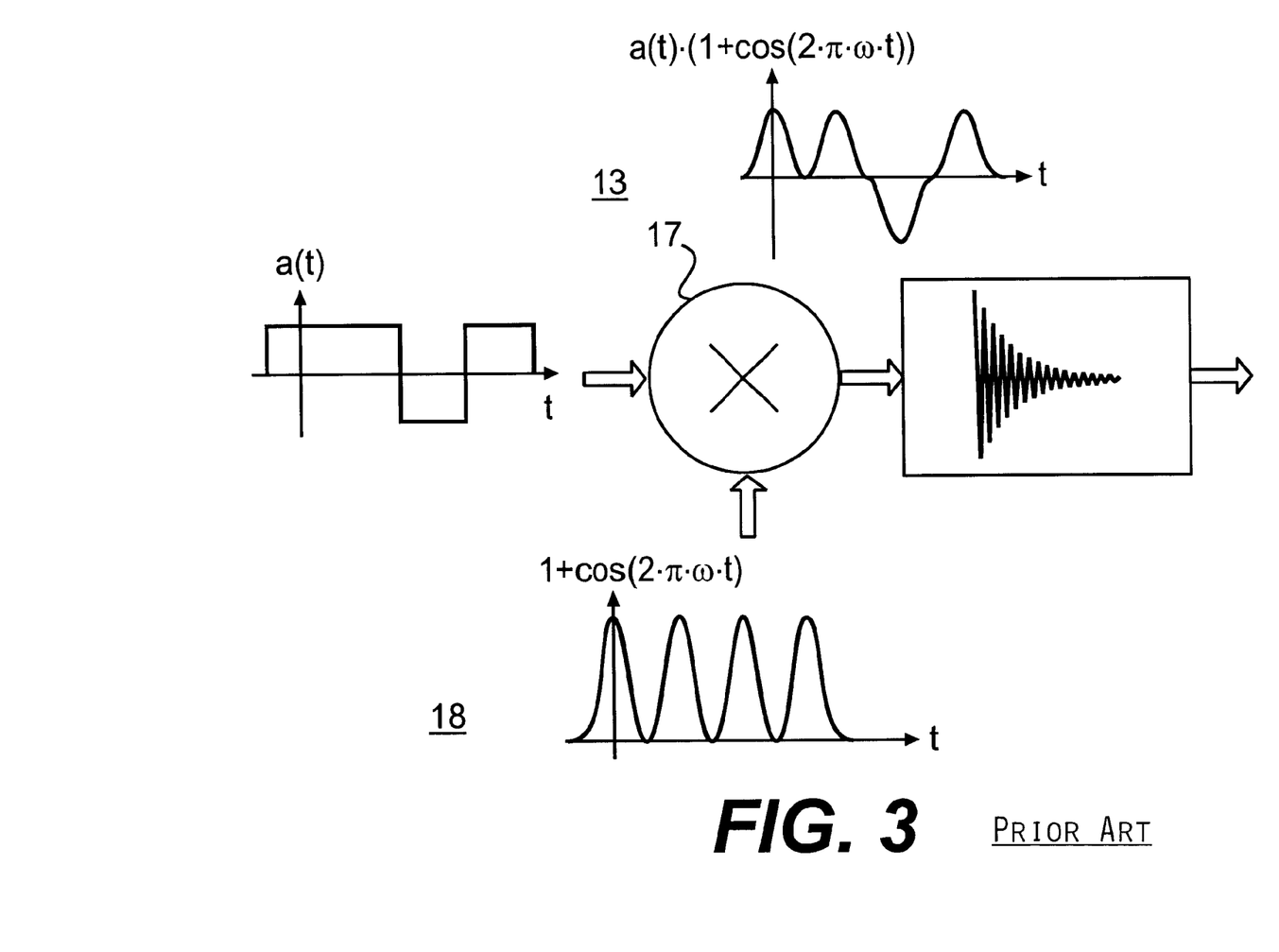
FIG. 3 illustrates the architecture of a SIN DAC.

Turning first to FIG. 3, the basic architecture of the SIN DAC is shown. The SIN DAC receives an input signal a(t) to a multiplier 17 input. A second input of the multiplier 17 receives a sine (cosine) voltage having a DC level associated with it. This composite signal may be represented by 1+COS (2πft). The result is a multiplication of the sine wave so that for positive values of a(t), the value of the output voltage of the SIN DAC is 1+COS(2πft), and for negative transitions, when the input data a(t) is a −1, an output voltage of −1−COS(2πft) is produced. The sine wave signal is phase locked with the clock signal in circuitry (not shown), so that data transitions occur at the point the sine wave signal voltage is at approximately a zero slope which reduces the amount of phase noise added to the analog signal.

Figure 4:
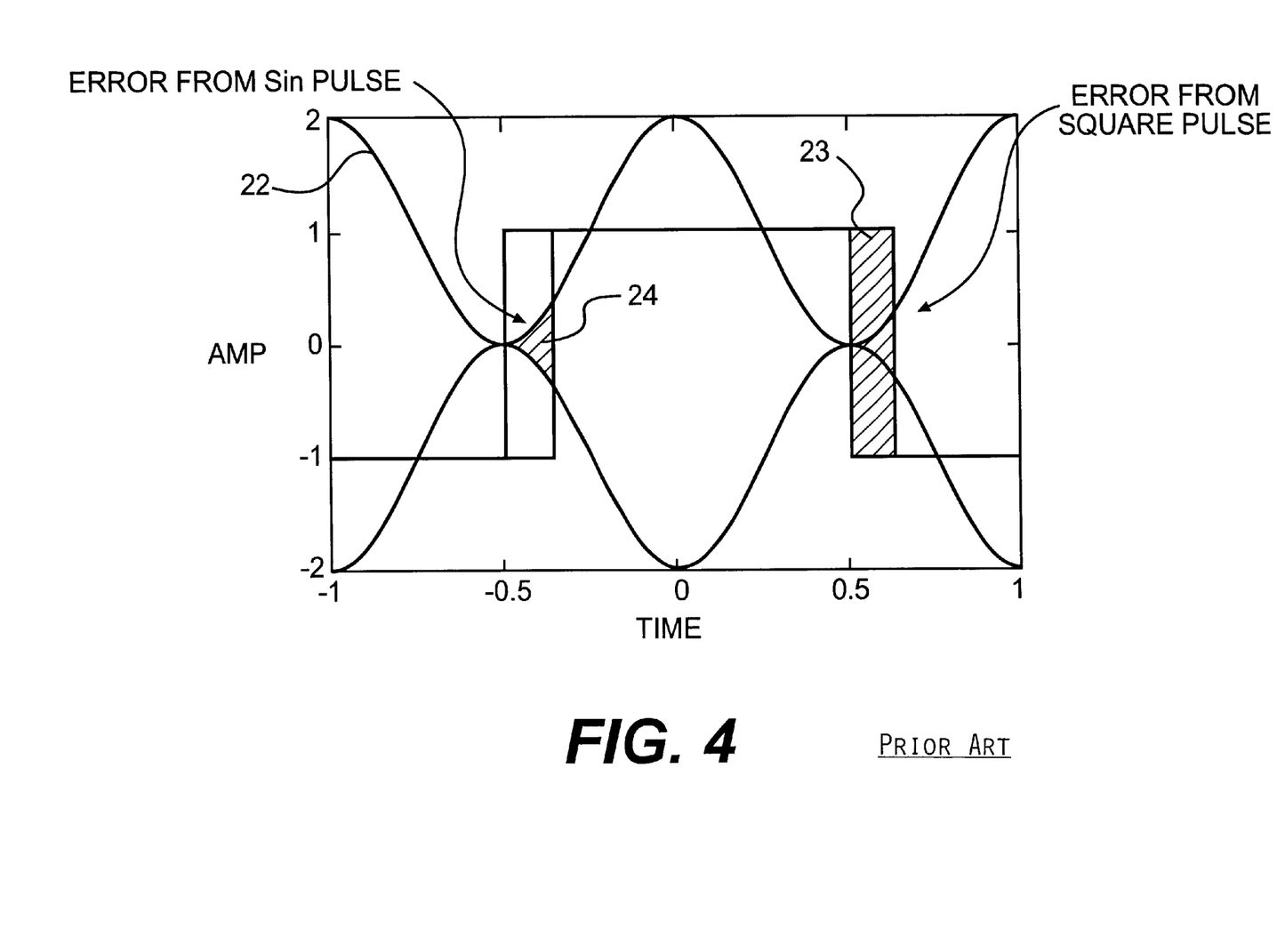
FIG. 4 illustrates the relative differences in signal error energy due to phase jitter on the digital input data and on the output signal of a SIN DAC.

The effects of the SIN DAC output voltage on phase noise is illustrated in to FIG. 4. As a data transition occurs, switching between each of the signals 1+COS 2πft and −1−COS 2πft occurs. Changes in the data transition, corresponding to changes in clock signal transitions shown in FIG. 2B, produce an output energy 24 which contributes noise. The noise energy 24 is considerably less than the noise energy 23 which is produced from the jitter which occurs in the edges of the digital data signal.

Figure 5:
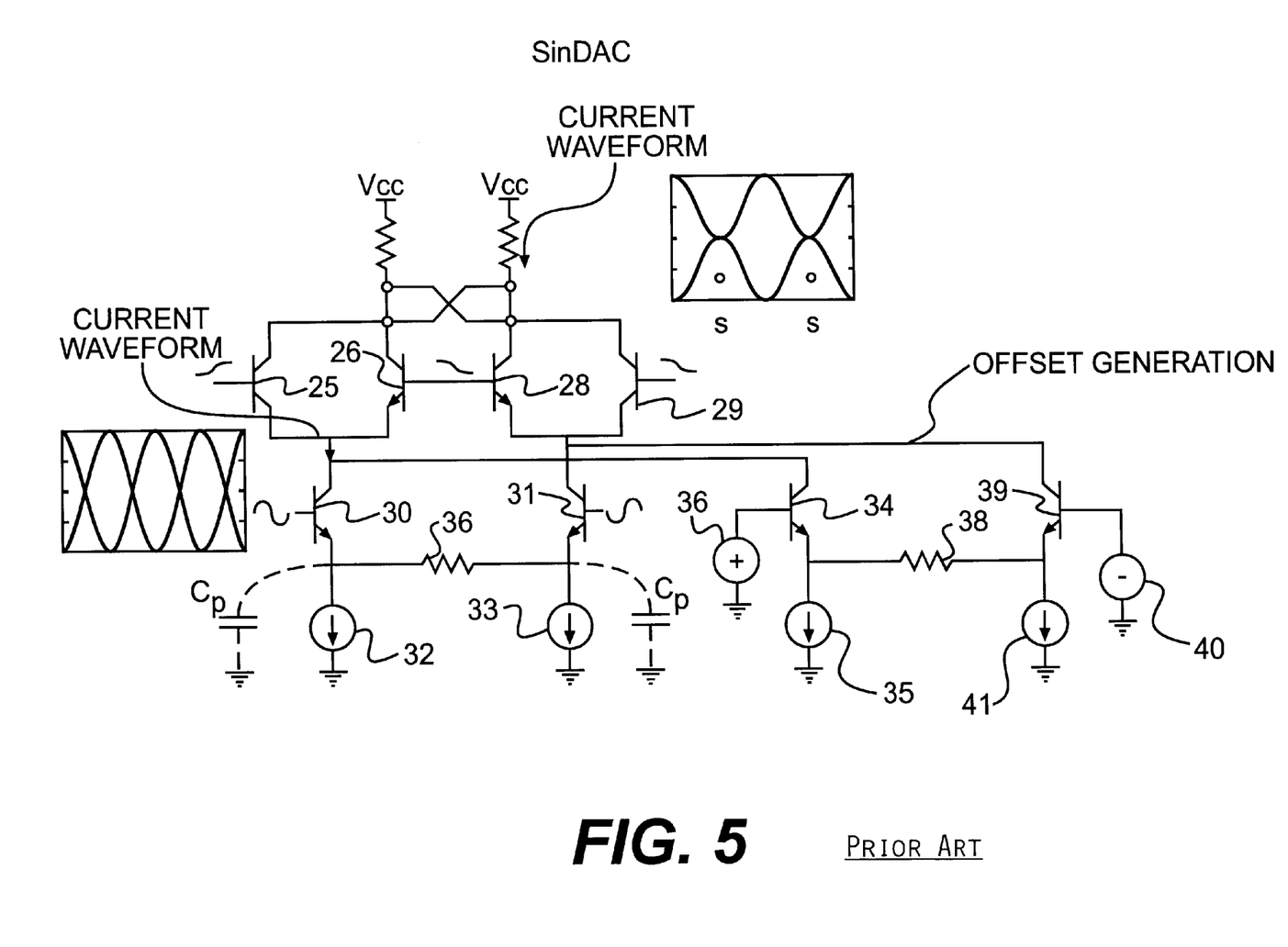
FIG. 5 is a schematic representation of an RZ SIN DAC.

FIG. 5 illustrates a schematic representation of a SIN DAC. An input sine wave signal is applied to the base of transistors 30 and 31 which are connected in a differential amplifier configuration. The sine signals produced from the collectors of transistors 31 and 30 are added with a DC offset voltage, representing +1 and −1. The offset voltage is produced from transistors 34 and 39, connected to respective voltage references 36 and 40. Current sources 35 and 41 provide the operating current for transistors 34 and 39. An emitter degeneration resistance 36, 38 is connected between the respective pairs of differential transistors.

The input data is applied to the bases of transistors 25, 26, and 28, 29. The collectors of transistors 26 and 28 produce one or the other of the cosine wave forms having a d.c. level of +1 or −1 corresponding to one or the other states of the input data signal.

Figure 6:
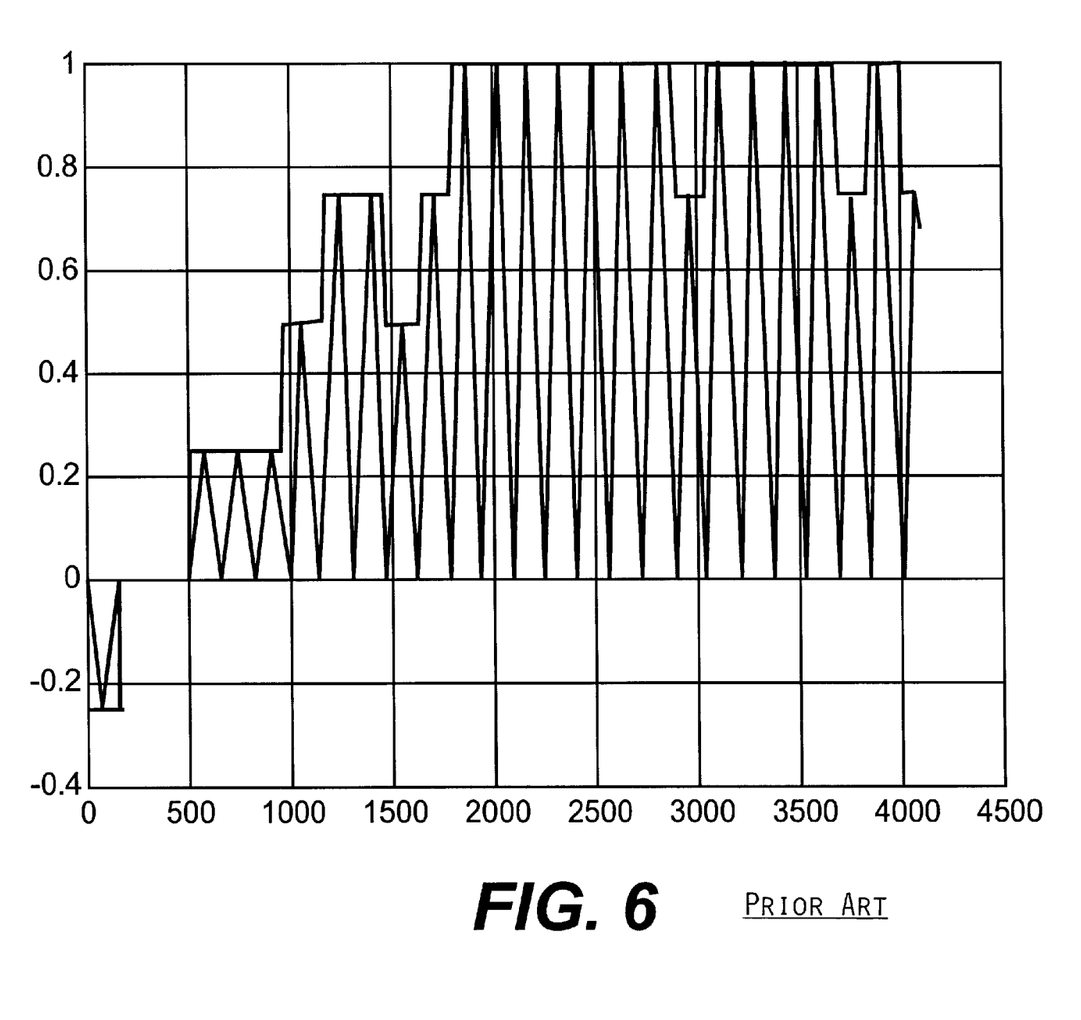
FIG. 6 illustrates the output of an RZ SIN DAC for different digital signals.

FIG. 6 illustrates the output voltage from an RZ SIN DAC for different values of input digital data. The representation of FIG. 6 illustrates the output voltage as the input digital data changes with time. Each value of input digital data produces a series of sine waves above zero volts, which are the source of high frequency noise in the output voltage. Additionally, the sinusoidal voltage swings can produce signal artifacts if they are processed by later circuitry which has any significant nonlinearities.

Figure 7:
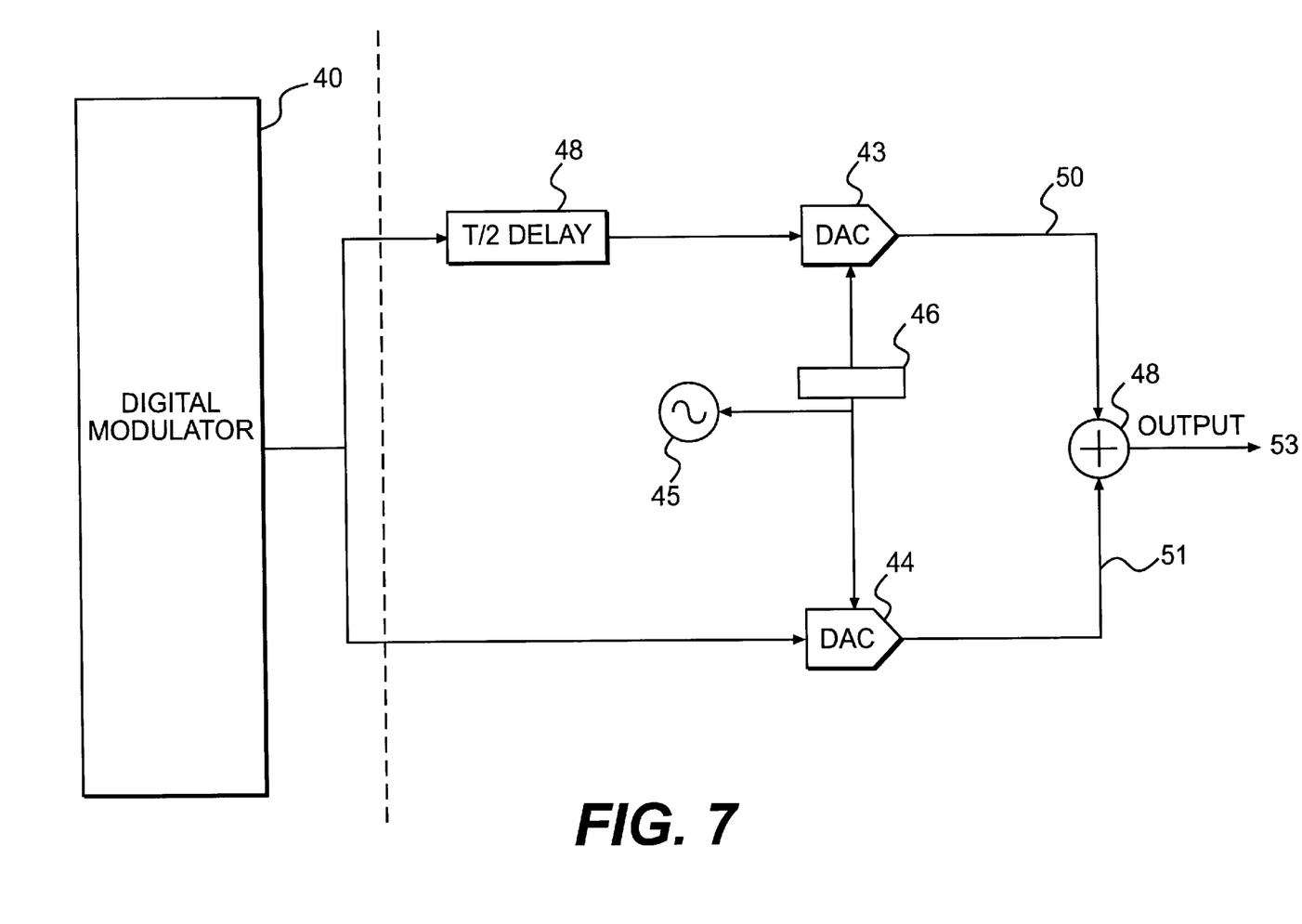
FIG. 7 represents a preferred embodiment of the invention for creating an NRZ SIN DAC.

To avoid the consequences of the RZ SIN DAC, the present invention proposes the use of a non-return to zero (NRZ) SIN DAC. Referring now to FIG. 7, an implementation in accordance with a preferred embodiment is shown which forms an NRZ output signal 53 from two RZ output signals 50, 51 produced by RZ SIN DAC 43 and RZ SIN DAC 44, previously described. Each of the SIN DACs 43 and 44, produce a sine voltage derived from sine (cosine) wave generator 45. The output of SIN DAC 43, however, is delayed as a phase shift network 46 is connected between the source of sine voltage 45 and SIN DAC 43 providing a relative phase shift between SIN DACs 43, 44 of approximately 180°.

Figure 8:
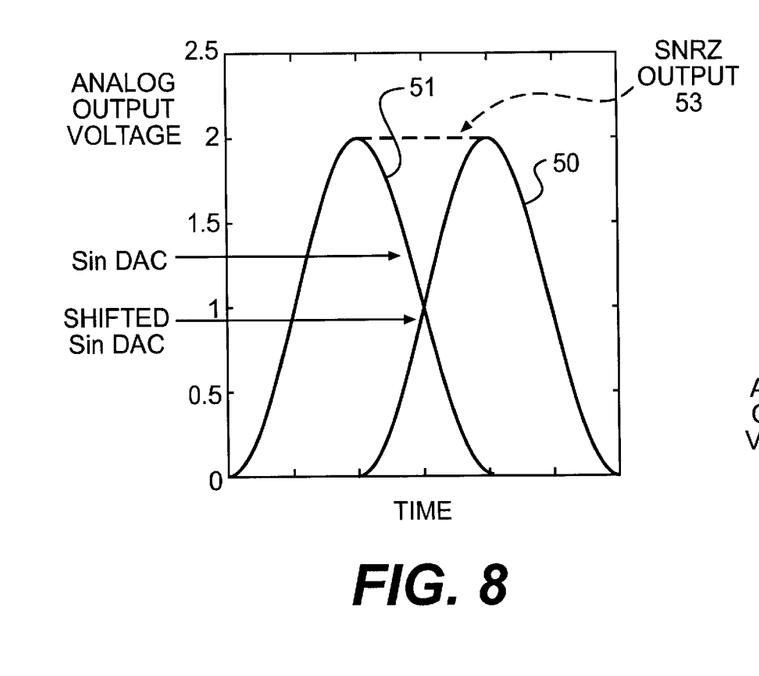
FIG. 8 illustrates the output voltages from the individual SIN DACs and the composite NRZ output voltage of the NRZ SIN DAC.
Figure 9:
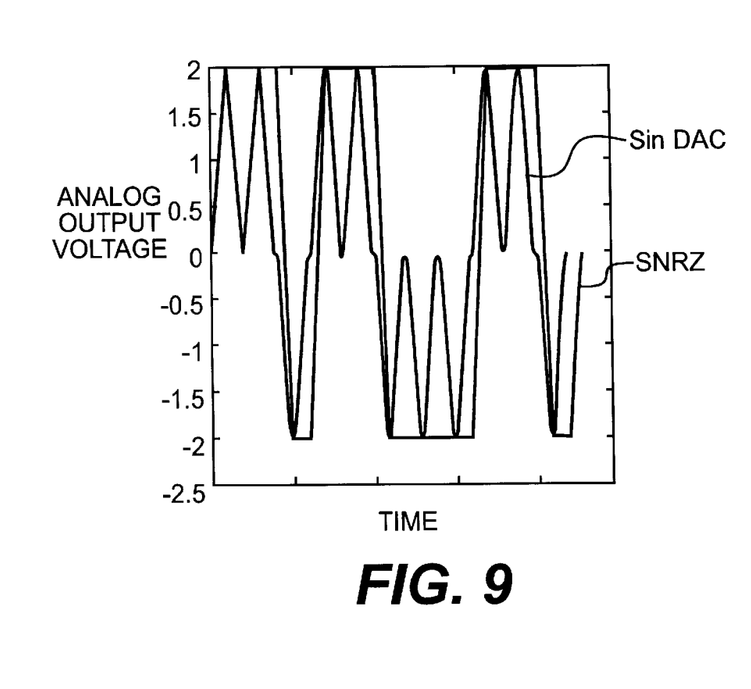
FIG. 9 illustrates the respective outputs of the NRZ SIN DAC, and the RZ SIN DAC.

Additionally, the input digital signal to SIN DAC 43 is delayed for one-half of a clock cycle period by delay circuit 41. The combined output signals 50, 51, from SIN DAC 43 and SIN DAC 44 is illustrated in FIG. 8. The composite signal 53 does not return to zero, except during a data transition. The effect is shown in FIG. 9, wherein the multiple voltage excursions between zero and either 1 or −1 is avoided, except during the data transition edges. NRZ signal 53 therefore has significantly less high frequency content than the signals 50, 51 produced by the RZ SIN DACs 43, 44.

Figure 10:
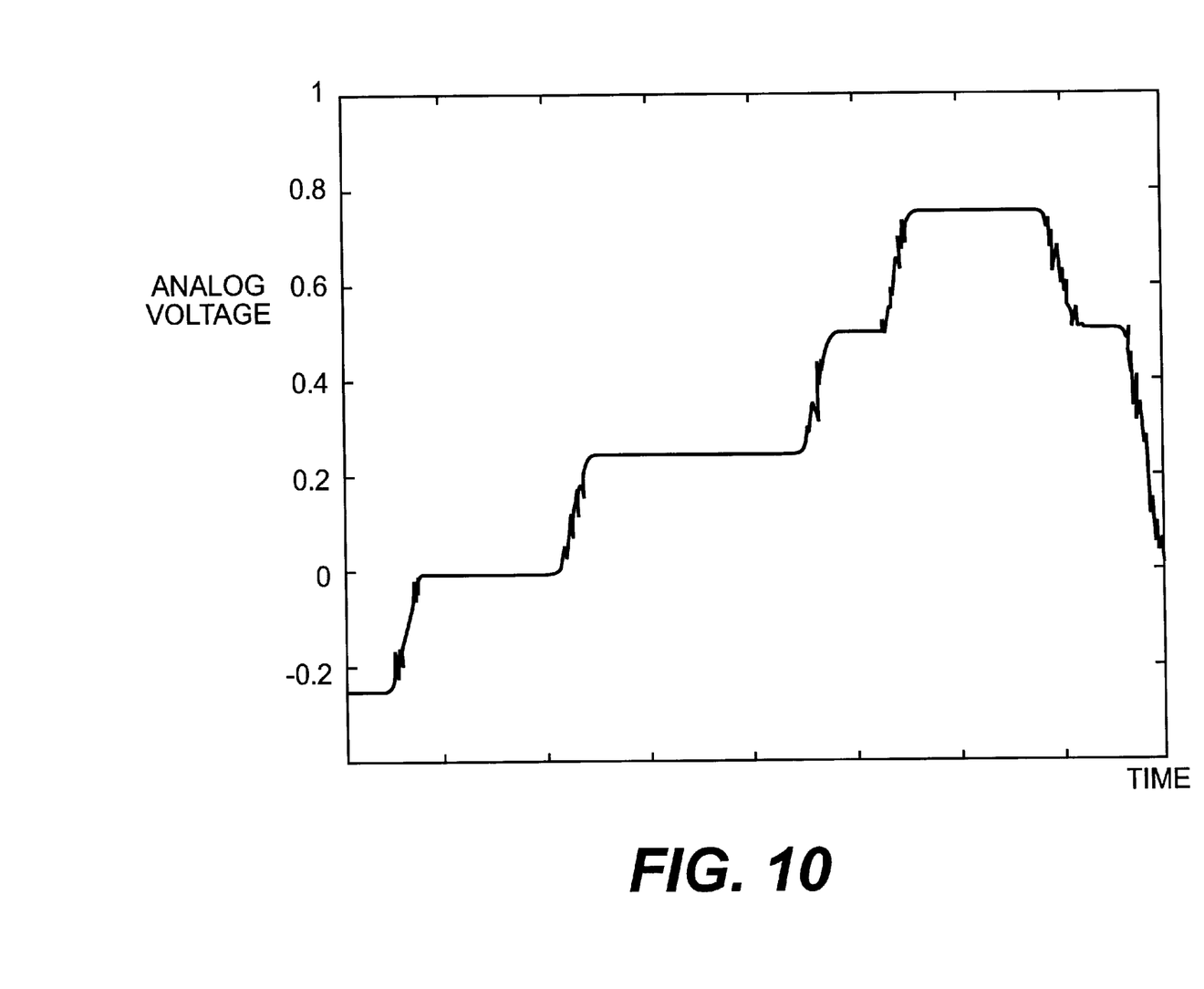
FIG. 10 illustrates the phase noise produced from data transitions of data being converted to an analog voltage.
Figure 11:
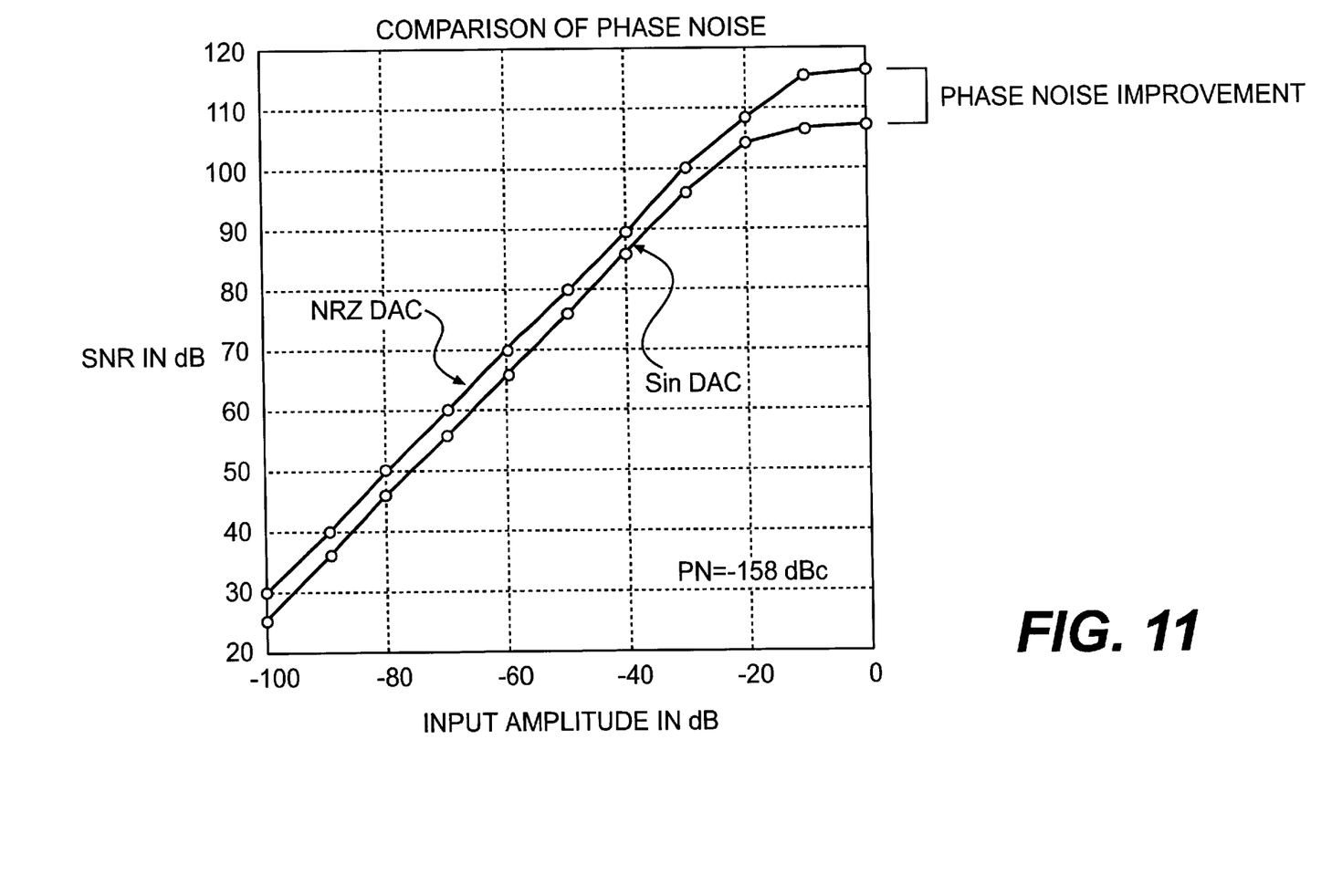
FIG. 11 illustrates the difference in signal to noise ratio of between the NRZ SIN DAC and RZ SIN DAC.

FIG. 10 illustrates the effects on noise produced due to the clock jitter. The analog output voltage is shown as a function of time, wherein the digital data values change over time to produce the different output values of analog voltage shown. The only significant contribution to phase noise occurs at the data transition edges. A comparison between the relative phase noise produced by an NRZ and RZ SIN DAC, expressed as a signal to noise ratio of the analog signal, is shown in FIG. 11. The NRZ SIN DAC demonstrates significantly less noise over the amplitude of the output signal shown. The fact that the NRZ sin DAC has a noise response limited to data transitions can be demonstrated below:

For a data input of a(t)=1, the output equals:

1+cos (2πft+$\phi_1$)

where $\phi_1$ is the phase noise.

For a data input of a(t)=−1, the output equals:

−1−cos ((2πft+$\phi_1$).

When there is no transition, the output for NRZ sin DAC equals:

1+cos (2πft+$\phi_1$)+1+cos (2πft+$\phi_1$+π)=2

The phase noise gets cancelled because there is a 180° (π) phase shift between sin DACs 60, 61.

When there is a data transition,

1+cos (2πft+$\phi_1$)−(1+cos (2πft+$\phi_1$+π))=2 cos (2πft+$\phi_1$), and the phase noise gets doubled.

In a multibit DAC, however, the probability of transition is low since the number of bits having a transition is much lower, resulting in the phase noise improvement.

While the embodiment of FIG. 7 contemplates combining the output of two RZ SIN DACs, it is of course possible to use four, or more SIN DACs, combining the outputs together to create an even smoother voltage waveform. In such a case, additional delays would be interposed between the digital signal and the SIN DACs. For instance, where four SIN DACs are used, each SIN DAC would receive a SIN voltage which is 90° shifted, and each digital signal would be delayed by one-fourth a clock period.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An NRZ SIN digital to analog converter comprising:

a source of reference sine waves;

a first SIN digital to analog converter connected to receive said reference sine waves; and an input digital signal a(t), said sine digital to analog converter providing an output proportional to $a(t)(1+\cos2\pi ft)$;

a first delay circuit delaying said input digital signal a(t) by a delay to produce a delayed input signal;

a second delay circuit for delaying said reference sine waves;

a second SIN digital to analog converter connected to receive a delayed digital signal from said delay circuit, and a delayed sine wave reference signal, and producing a signal proportional to $a(t)(-1-\cos2\pi ft)$; and a combiner circuit for combining first and second signals produced by said first and second digital to analog converters.

2. The NRZ digital to analog converter according to claim 1 further comprising a filter connected to receive said NRZ analog signal.

3. The method of generating an NRZ analog signal according to claim 2 wherein said digital signal is delayed one half a clock period, and said output signals are phase shifted 180 degrees.

4. The NRZ digital to analog converter according to claim 1 wherein said first delay circuit delays said input digital signal T/2, wherein T is proportional to the period of a clock signal related to said input digital signal.

5. An NRZ digital to analog converter comprising:

a first SIN digital to analog converter connected to receive a digital input signal, and a reference sine wave signal, said SIN digital to analog converter producing a signal $a(t)(1+\cos2\pi ft)$;

a second SIN digital to analog converter connected to receive a delayed version of said digital input signal, and a delayed version of said sine wave signal producing an output signal which is a delayed version of said first sine digital to analog converter output signal $a(t)(-1-\cos2\pi ft)$; and a combiner circuit connected to combine said first and second sine digital to analog converter output signals.

6. The NRZ digital to analog converter according to claim 5 wherein said delayed version of said sine wave signal is delayed 180 degrees.

7. The NRZ digital to analog converter according to claim 5 wherein said delayed version of said digital signal is delayed substantially T/2 clock periods of said digital signal.

8. A method for generating an NRZ analog signal from a digital signal comprising:

supplying said digital signal to a first RZ SIN DAC which produces an analog signal;

delaying said digital signal a fraction of a clock period of said digital signal;

supplying a delayed digital signal to a second RZ SIN DAC having an output signal phase shifted with respect to said first RZ sin DAC output signal; and combining said output signals from said first and second RZ SIN DACs to produce an NRZ sin DAC.

9. A delta sigma digital to analog converter comprising:

a digital interpolator for converting a first digital signal to a second digital signal;

a digital delta sigma modulator for converting said digital signal to a high resolution digital signal;

a feed forward DAC connected to receive said high resolution digital signal comprising:

a non return to zero sin DAC connected to receive said high resolution digital signal for converting said high resolution digital signal to an analog signal; and a filter for filtering said analog signal; wherein said non return to zero DAC includes:

first and second return to zero SIN DACs connected to receive said digital signal and a delayed version of said digital signal, respectively, said first and second return to zero RZ DACs having an outputs with different phases, and a summing junction connected to combine signals from said first and second return to zero RZ sin DACs, whereby said combined signals form a non return to zero NRZ signal.

10. The delta sigma digital to analog converter according to claim 9 wherein said digital signal and delayed digital signal differ by one half a clock period.

* * * * *